(12) United States Patent
Zhang et al.

(10) Patent No.: US 10,991,619 B2
(45) Date of Patent: Apr. 27, 2021

(54) TOP VIA PROCESS ACCOUNTING FOR MISALIGNMENT BY INCREASING RELIABILITY

(71) Applicant: INTERNATIONAL BUSINESS MACHINES CORPORATION, Armonk, NY (US)

(72) Inventors: Chen Zhang, Albany, NY (US); Lawrence A. Clevenger, Saratoga Springs, NY (US); Benjamin D. Briggs, Waterford, NY (US); Brent A. Anderson, Jericho, VT (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/387,628

(22) Filed: Apr. 18, 2019

(65) Prior Publication Data
US 2020/0335393 A1    Oct. 22, 2020

(51) Int. Cl.
*H01L 21/768*    (2006.01)

(52) U.S. Cl.
CPC .... *H01L 21/76843* (2013.01); *H01L 21/7684* (2013.01); *H01L 21/76802* (2013.01); *H01L 21/76831* (2013.01)

(58) Field of Classification Search
None
See application file for complete search history.

(56) References Cited

U.S. PATENT DOCUMENTS

| | | | |
|---|---|---|---|
| 6,140,220 A | 10/2000 | Lin | |
| 6,277,706 B1 | 8/2001 | Ishikawa | |
| 6,774,489 B2 | 8/2004 | Russell et al. | |
| 6,836,017 B2 | 12/2004 | Ngo et al. | |
| 7,187,085 B2 | 3/2007 | Clevenger et al. | |
| 8,247,322 B2 | 8/2012 | Chang et al. | |
| 9,536,830 B2 | 1/2017 | Bao et al. | |
| 2014/0332963 A1 | 11/2014 | Filippi et al. | |
| 2016/0005691 A1 | 1/2016 | Liu et al. | |
| 2018/0350662 A1* | 12/2018 | You .................... | H01L 29/785 |

OTHER PUBLICATIONS

Wu, "Fabrication and Characterization of Through-Substrate Interconnects", IEEE Transactions on Electron Devices, vol. 57, No. 6, Jun. 2010, pp. 1261-1268.

* cited by examiner

*Primary Examiner* — Steven M Christopher
(74) *Attorney, Agent, or Firm* — Tutunjian & Bitetto, P.C.; James Nock (57) ABSTRACT

A method for fabricating a semiconductor device to account for misalignment includes forming a top via on a first conductive line formed on a substrate, forming liners each using a first dielectric material, including forming first and second liners to a first height along sidewalls of the top via, forming dielectric layers, including forming first and second dielectric layers on the first conductive line to the first height and adjacent to the first and second liners, respectively, recessing the top via to a second height, and forming an additional dielectric layer on the recessed top via to the first height using a second dielectric material. The first and second dielectric materials are selected to compensate for potential misalignment between the first conductive line and the top via.

16 Claims, 8 Drawing Sheets

TOP VIA PROCESS ACCOUNTING FOR MISALIGNMENT BY INCREASING RELIABILITY

BACKGROUND

The present invention generally relates to semiconductor devices, and more particularly to semiconductor devices accounting for misalignment and methods of fabricating the same.

Semiconductor devices (e.g., integrated circuits) can include a plurality of transistors disposed within a semiconductor substrate. Back-end-of-line (BEOL) processing can be performed to form metallization layers that can be used to provide connections for the transistors. The metallization layers can include stacked layers of small conductive wires and vias that are disposed within a dielectric material over the semiconductor substrate. The wires can provide for lateral connections while the vias can provide for vertical connections between the wires. The metallization layers can increase in size as the metallization layers get further from the substrate of the semiconductor device, such that (tightly packed) small wires can be located near the transistors and larger wires can be located near a top of the stack.

SUMMARY

In accordance with an embodiment of the present invention, a method for fabricating a semiconductor device to account for misalignment is provided. The method includes forming a top via on a first conductive line formed on a substrate, and forming a plurality of liners using a first dielectric material. Forming the plurality of liners includes forming first and second liners to a first height along sidewalls of the top via. The method further includes forming a plurality of dielectric layers. Forming the plurality of dielectric layers includes forming first and second dielectric layers on the first conductive line to the first height and adjacent to the first and second liners, respectively. The method further includes recessing the top via to a second height, and forming an additional dielectric layer on the recessed top via to the first height using a second dielectric material. The first and second dielectric materials are selected to compensate for potential misalignment between the first conductive line and the top via.

In accordance with another embodiment of the present invention, a method for fabricating a semiconductor device to account for misalignment is provided. The method includes forming a plurality of dielectric portions on a substrate, forming a first conductive line on the substrate within a first trench between first and second ones of the plurality of dielectric portions, forming a top via on the first conductive line adjacent to the first and second dielectric portions, and forming a plurality of liners using a first dielectric material. Forming the plurality of liners includes forming first and second liners to a first height along sidewalls of the top via. The method further includes forming a plurality of dielectric layers after removing the plurality of dielectric portions. Forming the plurality of dielectric layers includes forming first and second dielectric layers on the first conductive line to the first height and adjacent to the first and second liners, respectively. The method further includes recessing the top via to a second height, and forming an additional dielectric layer on the recessed top via to the first height using a second dielectric material. The first and second dielectric materials are selected to compensate for potential misalignment between the first conductive line and the top via.

In accordance with yet another embodiment of the present invention, a semiconductor device having misalignment is provided. The device includes a first conductive line disposed on a substrate, a top via disposed on the first conductive line to a first height, and a plurality of liners each including a first dielectric material. The plurality of liners includes a first liner disposed on the first conductive line along the top via to the first height. The device further includes a plurality of dielectric layers including first and second dielectric layers disposed on the first conductive line to a second height and adjacent to the first and second liners, respectively, and third and fourth dielectric layers disposed on the substrate adjacent to the first conductive line. The device further includes an additional dielectric layer including a second dielectric material disposed on the top via to the second height. The plurality of liners further includes a second liner disposed on the first conductive line along the top via and the additional dielectric layer to the second height. The first and second dielectric materials compensate for misalignment between the first conductive line and the top via.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The embodiments described herein provide for the fabrication of a semiconductor device to account for misalignment using a top via process to increase reliability (e.g., breakdown reliability). The top via process can reduce back-end-of-line (BEOL) related resistive-capacitive (RC) delay, thereby increasing the speed of integrated circuits. In the top via process scheme, lines can be formed, and vias sitting on top of the lines can be formed (e.g., by selective metal growth). The alignment between the next-level lines and the vias can be determined by lithography, which is subject to misalignment, leading to reliability concerns.

The embodiments described herein can address the reliability concerns by using a reliability increasing dielectric material as liner/spacer material on via sidewalls and on a via top surface. For example, the reliability increasing dielectric material can include a high breakdown voltage dielectric material. The breakdown voltage of a dielectric material defines a maximum voltage difference that can be applied across the material before at least a portion of the dielectric material conducts electricity (e.g., when the dielectric material transitions from insulator to resistor). This voltage difference can create a weakened path within the dielectric material by creating permanent molecular or physical changes.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
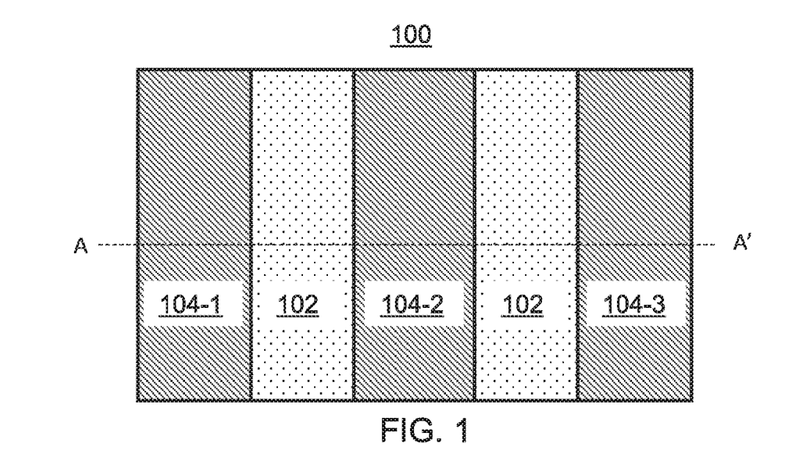
FIG. 1 is a top-down view of the formation of dielectric portions on a substrate during the fabrication of a semiconductor device, in accordance with an embodiment of the present invention.

Referring now to the drawings in which like numerals represent the same or similar elements and initially to FIG. 1, a top-down view of a semiconductor device 100 is provided showing the formation dielectric portions 104-1 through 104-3 formed on a substrate 102. The dielectric layer corresponding to the dielectric portions 104-1 through 104-3 can be formed on the substrate 102 using any suitable methods and/or structures in accordance with the embodiments described herein. For example, the dielectric layer corresponding to the dielectric portions 104-1 through 140-3 can be formed, e.g., with structures from a front-end-of-line (FEOL) process.

The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The dielectric portions 104-1 through 104-3 can include any suitable dielectric material in accordance with the embodiments described herein, and can be formed using any suitable deposition process in accordance with the embodiments described herein. For example, the dielectric portions 104-1 through 140-3 can include, e.g., silicon dioxide ($SiO_2$). Examples of suitable deposition processes that can be used to form the dielectric layer 104 include, but are not limited to, chemical vapor deposition (CVD), atomic layer deposition (ALD) and physical vapor deposition (PVD) processes.

Figure 2:
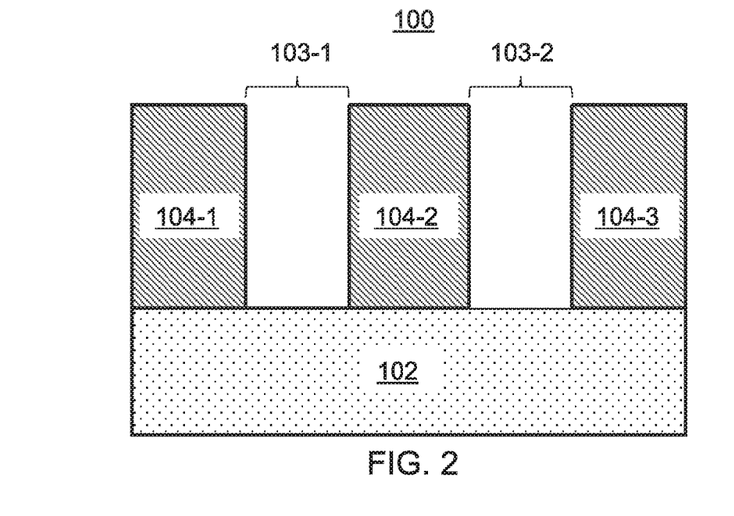
FIG. 2 is a cross-sectional view through the semiconductor device of FIG. 1, in accordance with an embodiment of the present invention.

With reference to FIG. 2, a cross-sectional view of the device 100 shown in FIG. 1 through line A-A' is provided illustrating a view of the formation of the dielectric portions 104-1 through 104-3. As shown, forming the dielectric portions 104-1 through 104-3 includes forming a plurality of trenches 103-1 and 103-2 within a dielectric layer previously formed on the substrate 102.

Figure 3:
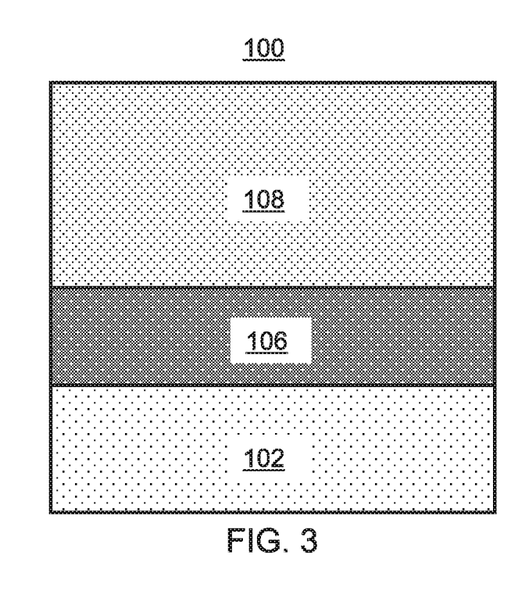
FIG. 3 is a cross-sectional view of the formation of a first conductive line and an interlayer dielectric during the fabrication of the semiconductor device, in accordance with an embodiment of the present invention.

With reference to FIG. 3, a cross-sectional view of the device 100 is provided illustrating the formation of a conductive line 106 within the trench 103-1 including conductive material (e.g., a metal) on the substrate 102, and the formation of an interlayer dielectric 108 on the conductive line 106. The cross-sectional view of FIG. 3 is taken through the region between dielectric portions 104-1 and 104-2.

Figure 4:
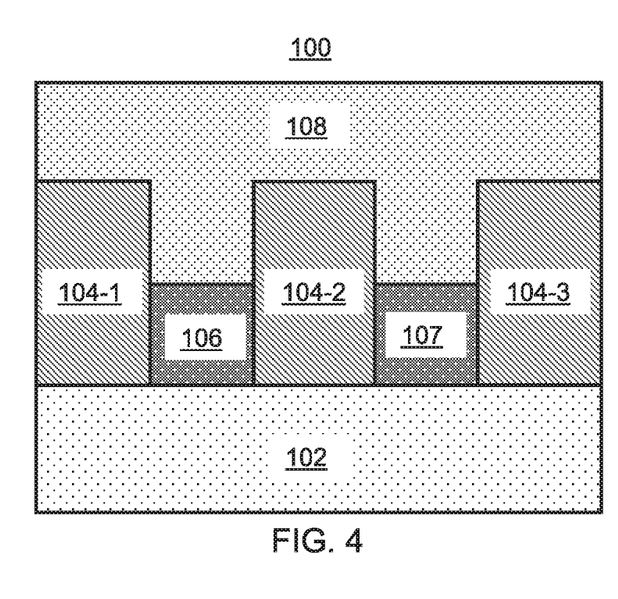
FIG. 4 is a cross-sectional view of the formation of the first conductive line, a second conductive line and an interlayer dielectric during the fabrication of the semiconductor device, in accordance with an embodiment of the present invention.

With reference to FIG. 4, another cross-sectional view of the device 100 is provided illustrating the formation of the conductive line 106 on the substrate 102 within the trench 103-1 between the dielectric portions 104-1 and 104-2, another conductive line 107 on the substrate 102 within the trench 103-2 between the dielectric portions 104-2 and 104-3, and the interlayer dielectric 108 on the dielectric portions 104-1 through 104-3 and the conductive lines 106 and 107. The cross-sectional view of FIG. 4 is taken across the device 100 through the dielectric portions 104-1 through 104-3 (e.g., similar to line A-A' of FIG. 1).

Forming the conductive lines 106 and 107 can include filling the conductive material in the trenches 103, planarizing the conductive material to the dielectric portions 104-1 through 104-3, and recessing the conductive material. Any suitable processes can be used to planarize and recess the conductive material to form the conductive lines 106 and 107 in accordance with the embodiments described herein. For example, the conductive material can be planarized using, e.g., chemical-mechanical planarization (CMP), and the planarized conductive material can then be recessed using a suitable etch process. The conductive lines 106 and 107 can include any suitable conductive material in accordance with the embodiments described herein. For example, the conductive lines 106 and 107 can include, e.g., a metal.

The interlayer dielectric 108 can include any suitable dielectric material in accordance with the embodiments described herein, and can be formed using any suitable deposition process in accordance with the embodiments described herein. For example, the interlayer dielectric 108 can include, e.g., $SiO_2$. Examples of suitable deposition processes that can be used to form the interlayer dielectric 108 include, but are not limited to, CVD, ALD and PVD processes.

Figure 5:
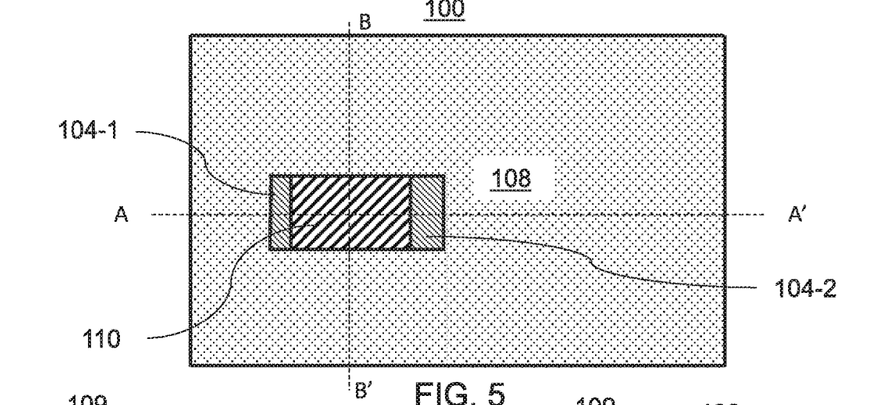
FIG. 5 is a top-down view of the formation of via material during the fabrication of a semiconductor device, in accordance with an embodiment of the present invention.

With reference to FIG. 5, a top-down view of the device 100 is provided showing the formation of via material 110 adjacent to dielectric portions 104-1 and 104-2. Further details regarding the formation of the via material 110 will now be described with reference to FIGS. 6 and 7.

Figure 6:
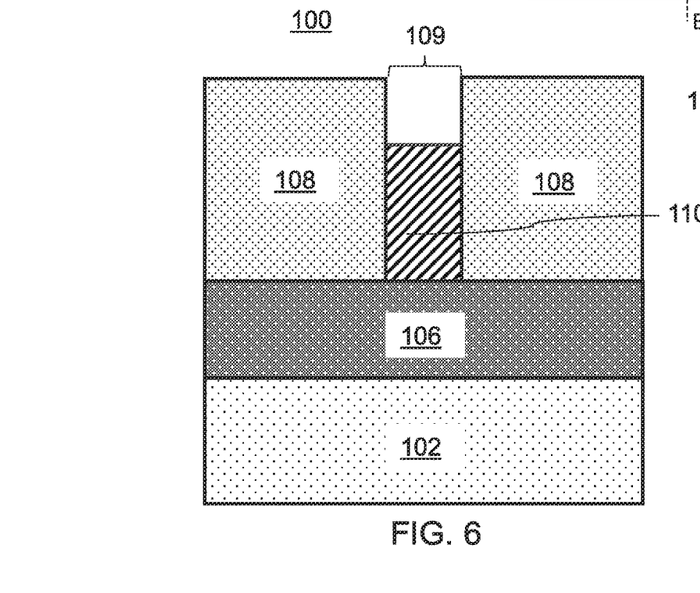
FIG. 6 is a cross-sectional view through the semiconductor device of FIG. 6, in accordance with an embodiment of the present invention.

With reference to FIG. 6, a cross-sectional view of the device 100 shown in FIG. 5 through line B-B' is provided illustrating the formation of the via material 110. As shown, the via material 110 is formed on the conductive line 106 within a via hole 109 formed within the interlayer dielectric 108. The via hole 109 can be formed using any suitable process in accordance with the embodiments described herein (e.g., an etch process). The via material 110 can be formed using any suitable process in accordance with the embodiments described herein.

Figure 7:
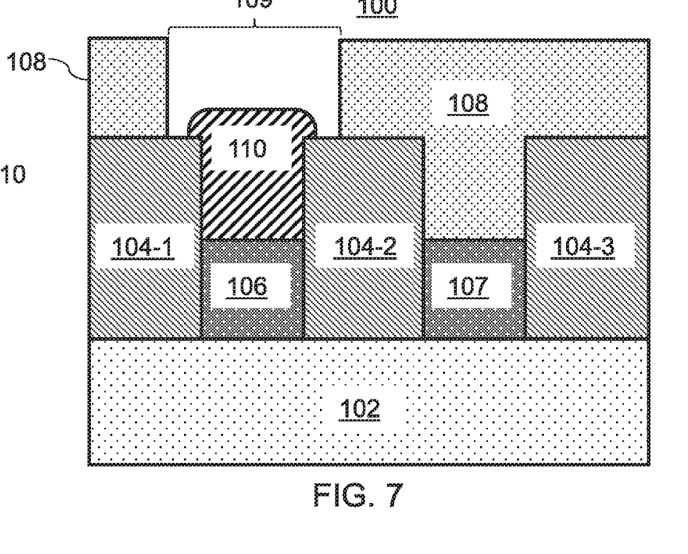
FIG. 7 is a cross-sectional view through the semiconductor device of FIG. 6, in accordance with an embodiment of the present invention.

With reference to FIG. 7, a cross-sectional view of the device 100 shown in FIG. 5 through line A-A' is provided illustrating another view of the formation of the via material 110. As shown, the via material is formed on the conductive line 106 within the via hole 109 formed within the interlayer dielectric 108 between the dielectric portions 104-1 and 104-2. As further shown, the via material 110 can flow over onto the adjacent dielectric portions 104-1 and 104-2.

Figure 8:
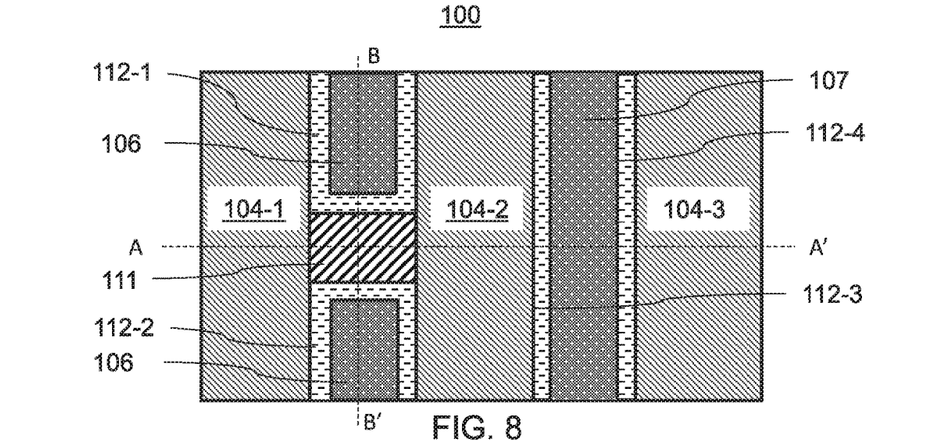
FIG. 8 is a top-down view of the formation of a top via from the via material during the fabrication of the semiconductor device, in accordance with an embodiment of the present invention.

With reference to FIG. 8, a top-down view of the device 100 is provided showing the formation of a top via 111 from the via material 110, the removal of the interlayer dielectric 108, and the formation of liners 112-1 through 112-4. For example, the top via 111 can be formed by planarizing (e.g., using CMP) to remove the via material 110 up to the top of the dielectric layer 104, the interlayer dielectric 108 can be removed after the planarization by selective etching (which can be, e.g., a partial recess), and the liners 112-1 through 112-4 can then be formed after the interlayer dielectric 108 is removed.

Figure 9:
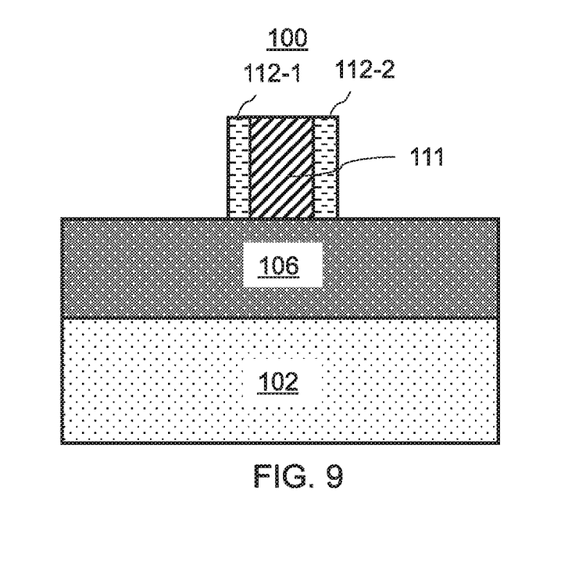
FIG. 9 is a cross-sectional view through the semiconductor device of FIG. 9, in accordance with an embodiment of the present invention.

With reference to FIG. 9, a cross-sectional view of the device 100 shown in FIG. 8 through line B-B' is provided illustrating the formation the liners 112-1 and 112-2 on the conductive line 106 along the sidewalls of the top via 111.

Figure 10:
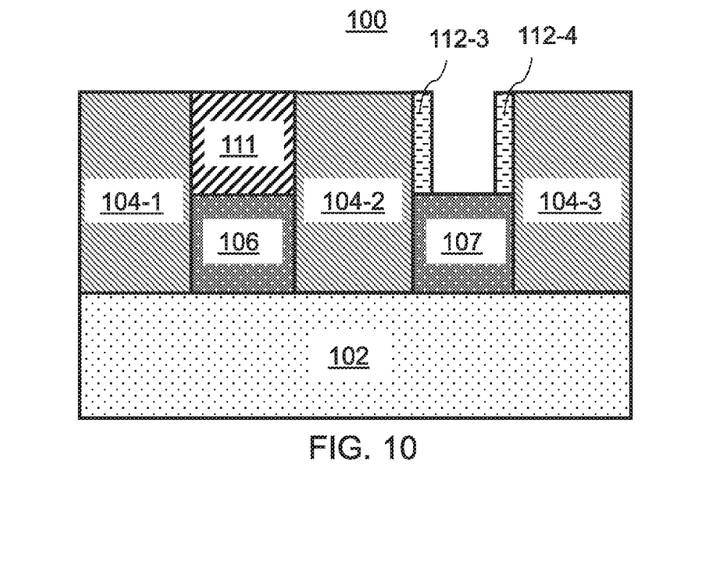
FIG. 10 is a cross-sectional view through the semiconductor device of FIG. 9, in accordance with an embodiment of the present invention.

With reference to FIG. 10, a cross-sectional view of the device 100 shown in FIG. 8 through line A-A' is provided illustrating the formation of the top via 111 on the conductive line 106, the formation of the liner 112-3 on the conductive line 107 along a sidewall of dielectric portion 104-2, and the formation of the liner 112-4 on the conductive line 107 along a sidewall of dielectric portion 104-3. Any suitable process can be used to form the liners 112-1 through 112-4 in accordance with the embodiments described herein.

The liners 112-1 through 112-4 can include a dielectric material having a breakdown voltage that increases device reliability with respect to device misalignment, as will be further described below with reference to FIGS. 16-18. More specifically, the liners 112-1 through 112-4 can include, e.g., a dielectric material having a minimized porosity sufficient to withstand voltage breakdown even when device misalignment occurs, in accordance with the embodiments described herein.

The liners 112-1 through 112-4 can include, e.g., a high quality oxide material (e.g., $SiO_2$), a high quality nitride material (e.g., SiN), or any other high quality dielectric material in accordance with the embodiments described herein. For example, the liners 112-1 through 112-4 can include $SiO_2$, SiN, or other dielectric material having low defect density and low porosity. Porosity in many instances dominates. The porosity, more specifically, for the liners 112-1 through 112-4, can include a porosity of less than, e.g., about 10%, preferably less than about 5% and more preferably less than, e.g., about 2%. In one embodiment, the liners 112-1 through 112-4 can include a porosity approaching about 0%.

For example, the liners 112-1 through 112-4 can include a $SiO_2$ material having a density of, e.g., about 2 gm/cm$^3$ to about 2.5 gm/cm$^3$ and, more preferably, having a density of, e.g., about 2.2 gm/cm$^3$. As another example, the liners 112-1 through 112-4 can include a SiN material having a density of, e.g., about 3 gm/cm$^3$ to about 3.5 gm/cm$^3$ and, more preferably, having a density of, e.g., about 3.2 gm/cm$^3$.

It is to be understood that the above-referenced examples of dielectric materials that the liners 112-1 through 112-4 can be formed from are non-limiting examples, and it is to be appreciated that the liners 112-1 through 112-4 can be formed from any suitable dielectric material in accordance with the embodiments described herein.

Figure 11:
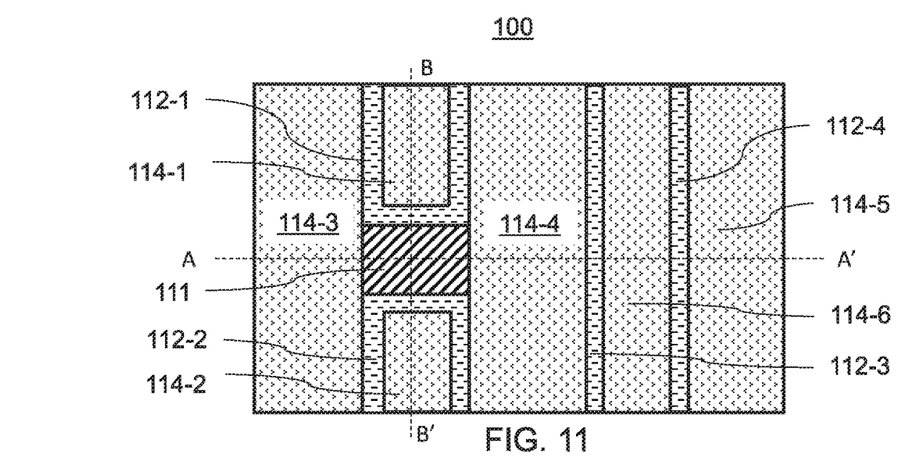
FIG. 11 is a top-down view of the removal of the dielectric portions, the formation of dielectric layers, and the recessing of the top via during the fabrication of the semiconductor device, in accordance with an embodiment of the present invention.

With reference to FIG. 11, a top-down view of the device 100 is provided showing the removal of the dielectric portions 104-1 through 104-3, the formation of dielectric layers 114-1 through 114-6, and the recessing of the top via 111.

The dielectric layers 114-1 through 114-6 can include a low-k dielectric material. A low-k dielectric material is a material with a dielectric constant less than the dielectric constant of $SiO_2$ at room temperature (e.g., about 20° C.-25° C.) and atmospheric pressure (e.g., about 1 atm). For example, a low-k dielectric material can have a dielectric constant of less than about 3.9. In one embodiment, the low-k dielectric layer includes a dielectric constant ranging from about 1.0 to about 3.0. Examples of low-k dielectric materials include, but are not limited to, organosilicate glass or carbon doped oxides (e.g., SiCOH), aromatic hydrocarbon polymer compositions, fluorine-doped oxides (e.g., fluorine-doped $SiO_2$), spin-on organic polymeric dielectrics, spin-on silicon based polymeric dielectrics, etc. In one embodiment, the low-k dielectric material can be a low quality material (e.g., porous) to achieve a sufficiently low-k dielectric material.

Figure 12:
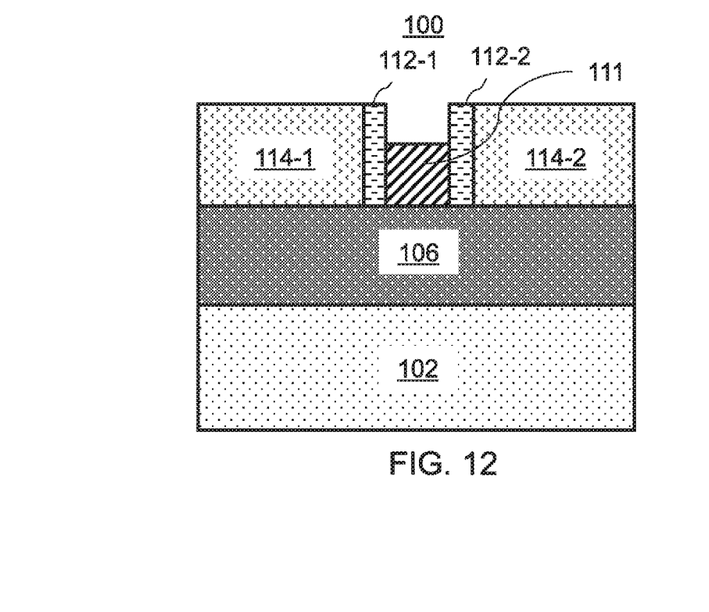
FIG. 12 is a cross-sectional view through the semiconductor device of FIG. 12, in accordance with an embodiment of the present invention.

With reference to FIG. 12, a cross-sectional view of the device 100 shown in FIG. 11 through line B-B' is provided illustrating the removal of the dielectric portions 104-1 through 104-3, the formation of the dielectric layers 114-1 and 114-2 on the conductive line 106, and the recessing of the top via 111.

Figure 13:
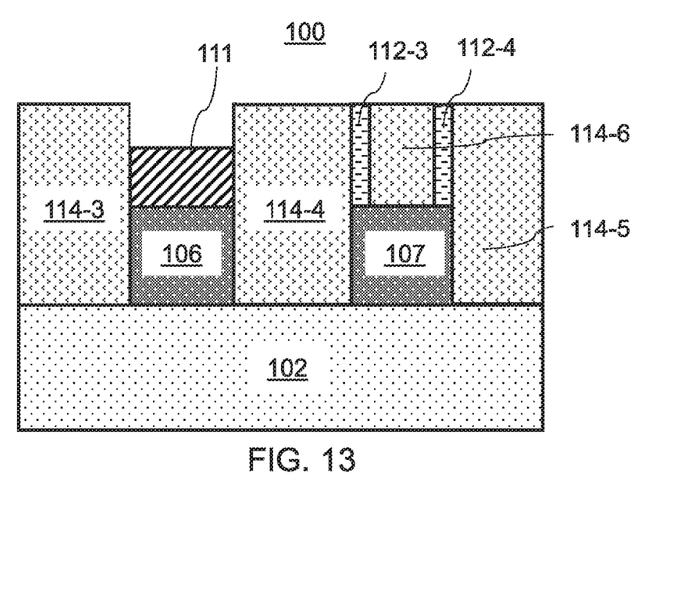
FIG. 13 is a cross-sectional view through the semiconductor device of FIG. 12, in accordance with an embodiment of the present invention.

With reference to FIG. 13, a cross-sectional view of the device 100 shown in FIG. 11 through line A-A' is provided illustrating the removal of the dielectric portions 104-1 through 104-3, the formation of the dielectric layers 114-3, 114-4 and 114-5 on the substrate 102 and the formation of the dielectric layer 114-6 on the conductive line 107, and the recessing of the top via 111. In one embodiment, at least liners 112-3 and 112-4 can optionally be removed during this process due to their small footage.

Figure 14:
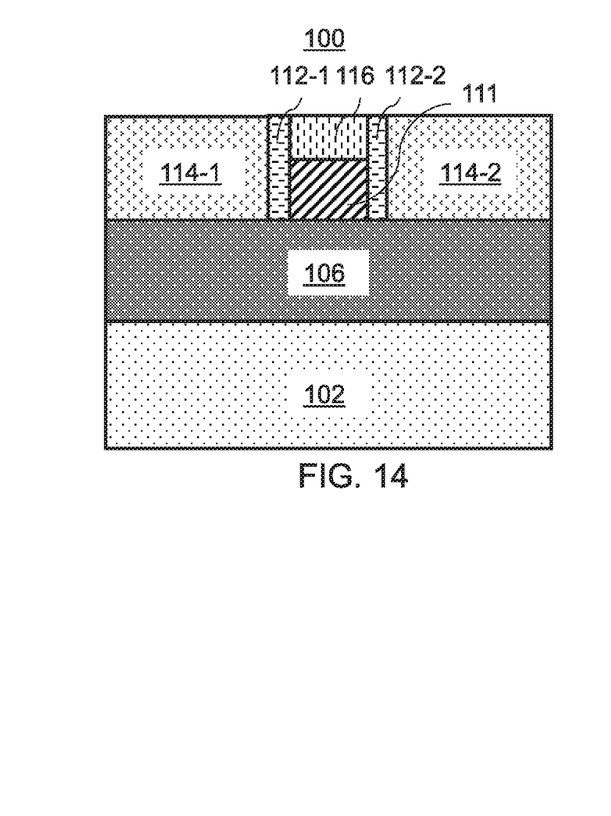
FIG. 14 is a cross-sectional view of the formation of a reliability increasing additional dielectric layer on the top via during the fabrication of the semiconductor device, in accordance with an embodiment of the present invention.

With reference to FIG. 14, a cross-sectional view of the device 100 is provided illustrating the formation of a reliability increasing additional dielectric layer 116 on the top via 111. The cross-sectional view of FIG. 14 is taken within a region between the dielectric layers 114-3 and 114-4 (e.g., similar to line B-B' of FIG. 11).

Figure 15:
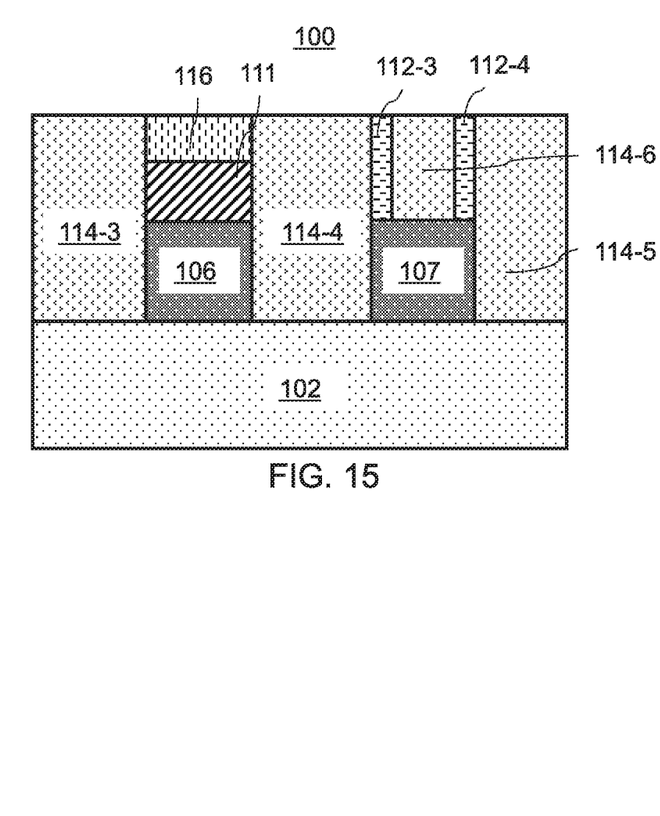
FIG. 15 is another cross-sectional view of the formation of the additional dielectric layer on the top via during the fabrication of the semiconductor device, in accordance with an embodiment of the present invention.

With reference to FIG. 15, another cross-sectional view of the device 100 is provided illustrating the formation of the additional dielectric layer 116 on the top via 111. The cross-sectional view of FIG. 15 is taken across the device 100 through the dielectric layers 114-3 through 114-5 (e.g., similar to line A-A' of FIG. 11). As shown, the additional dielectric layer 116 can be formed to a height of the liners 112-1 and 112-2, which can be substantially similar to the height of the dielectric layers 114-1 and 114-2.

The additional dielectric layer 116 can be formed by depositing, over the device 100, dielectric material having a breakdown voltage that is suitable for increasing device reliability with respect to device misalignment (as will be described in further detail below with reference to FIGS. 17 and 18), and planarizing the dielectric material up to a height of the dielectric layers 114-1 through 114-6 (e.g., using CMP). The additional dielectric layer 116 can include a dielectric material similar to that described above with reference to FIG. 10. The additional dielectric layer 116 can include a same or different material than the liners 112-1 through 112-4.

Figure 16:
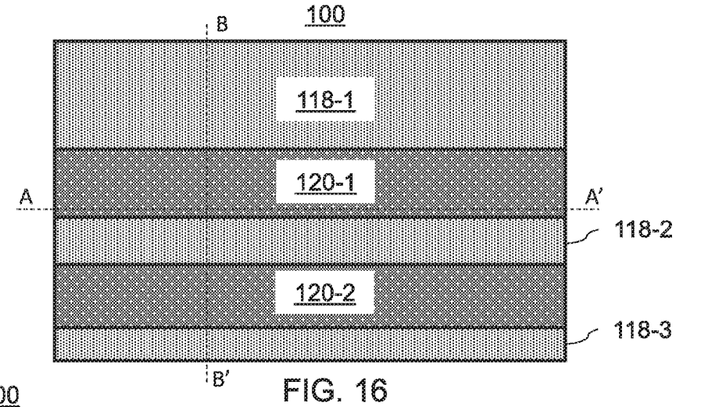
FIG. 16 is a top-down view of the formation of additional dielectric portions and conductive lines during the fabrication of the semiconductor device, in accordance with an embodiment of the present invention.

With reference to FIG. 16, a top-down view of the device 100 is provided showing the formation of dielectric portions 118-1 through 118-3, and the formation of conductive lines 120-1 and 120-2. The dielectric portions 118-1 through 118-3 can be formed by depositing a dielectric layer, and forming trenches corresponding to the conductive lines 120-1 and 120-2. Prior to forming the lines 120-1 and 120-2, portions of the liners 112-1 through 112-4 and the additional dielectric layer 116 can be selectively etched, and the conductive lines 120-1 and 120-2 can be formed by filling the trenches between the dielectric portions 118-1 through 118-3, and the void created by the selective etch, with a conductive material (e.g. metal) and planarizing the conductive material (e.g., using CMP).

Figure 17:
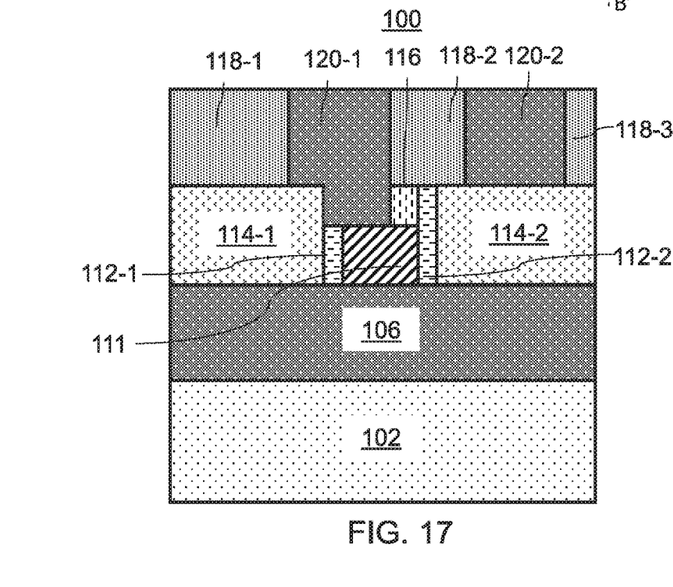
FIG. 17 is a cross-sectional view through the semiconductor device of FIG. 19, in accordance with an embodiment of the present invention.

With reference to FIG. 17, a cross-sectional view of the device 100 shown in FIG. 16 through line B-B' is provided illustrating the formation of the dielectric portions 118-1 through 118-3 and the conductive lines 120-1 and 120-2.

More specifically, the dielectric portion 118-1 can be formed on the dielectric layer 114-1. The dielectric portion 118-2 can be formed on the remaining portion of the additional dielectric layer 116, the liner 112-2 and the dielectric layer 114-2. The dielectric portion 118-3 can be formed on the dielectric layer 114-2.

The conductive line 120-1 can be formed between the dielectric portions 118-1 and 118-2 on the dielectric layer 114-1, the liner 112-1 and the top via 111 (adjacent to the remaining portion of the additional dielectric layer 116). The conductive line 120-2 can be formed between the dielectric portions 118-1 and 118-2 on the dielectric layer 114-2. The conductive line 120-1 can be electrically connected to the top via 111, while the conductive line 120-2 can be isolated from the conductive line 120-1 and the top via 111.

As can be seen in FIG. 17, the liner 112-1 and the top via 111 can have a substantially similar height, while the dielectric layers 114-1 and 114-2 and the liner 112-2 can have a substantially similar height greater than the height of the liner 112-1 and the top via 111. Additionally, the additional dielectric layer 116, after the selective etch, can still be at height of the dielectric layers 114-1 and 114-2 and the top via 111.

Figure 18:
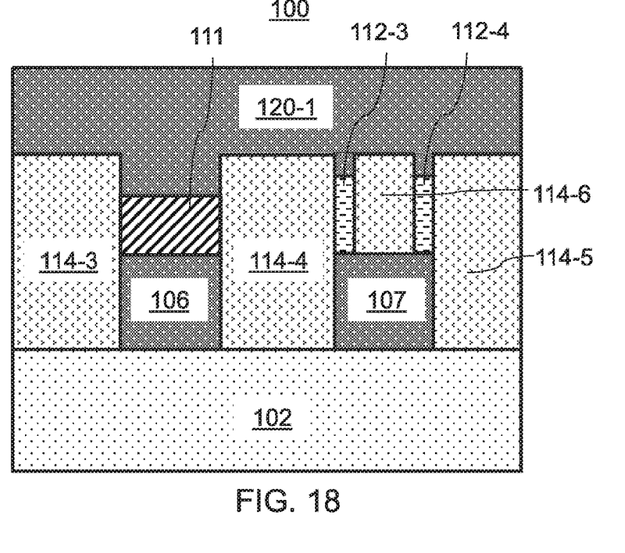
FIG. 18 is a cross-sectional view through the semiconductor device of FIG. 19, in accordance with an embodiment of the present invention.

With reference to FIG. 18, a cross-sectional view of the device 100 shown in FIG. 16 through line A-A' is provided further illustrating the formation of a conductive line 120-1. As shown, the conductive line 120-1 is formed on the dielectric layer 114-3, the top via 111, the dielectric layer 114-4, the liner 112-3, the dielectric layer 114-5, the liner 112-4, and the dielectric layer 114-6.

In a case of perfect alignment, the conductive line 120-1 would have sat directly on the top via 111 with no lateral offset. However, the processing performed to achieve the device shown in FIGS. 16-18 represents a case of misalignment (as visible in FIG. 17), where conductive lines 120-1 and 120-2 are misaligned to the top via 111 with an offset toward the left. Even in this misaligned case, the distance between the top-right corner of the top via 111 and the lower-left corner of the conductive line 120-1 is increased due to the presence of the additional dielectric layer 116. Since the additional dielectric layer 116 and the liner 112-2 include a high breakdown voltage dielectric material, breakdown reliability between the conductive line 120-1 and the top via 111 can be improved with respect to the misalignment. Accordingly, material selection can be used to solve the misalignment problem.

Figure 19:
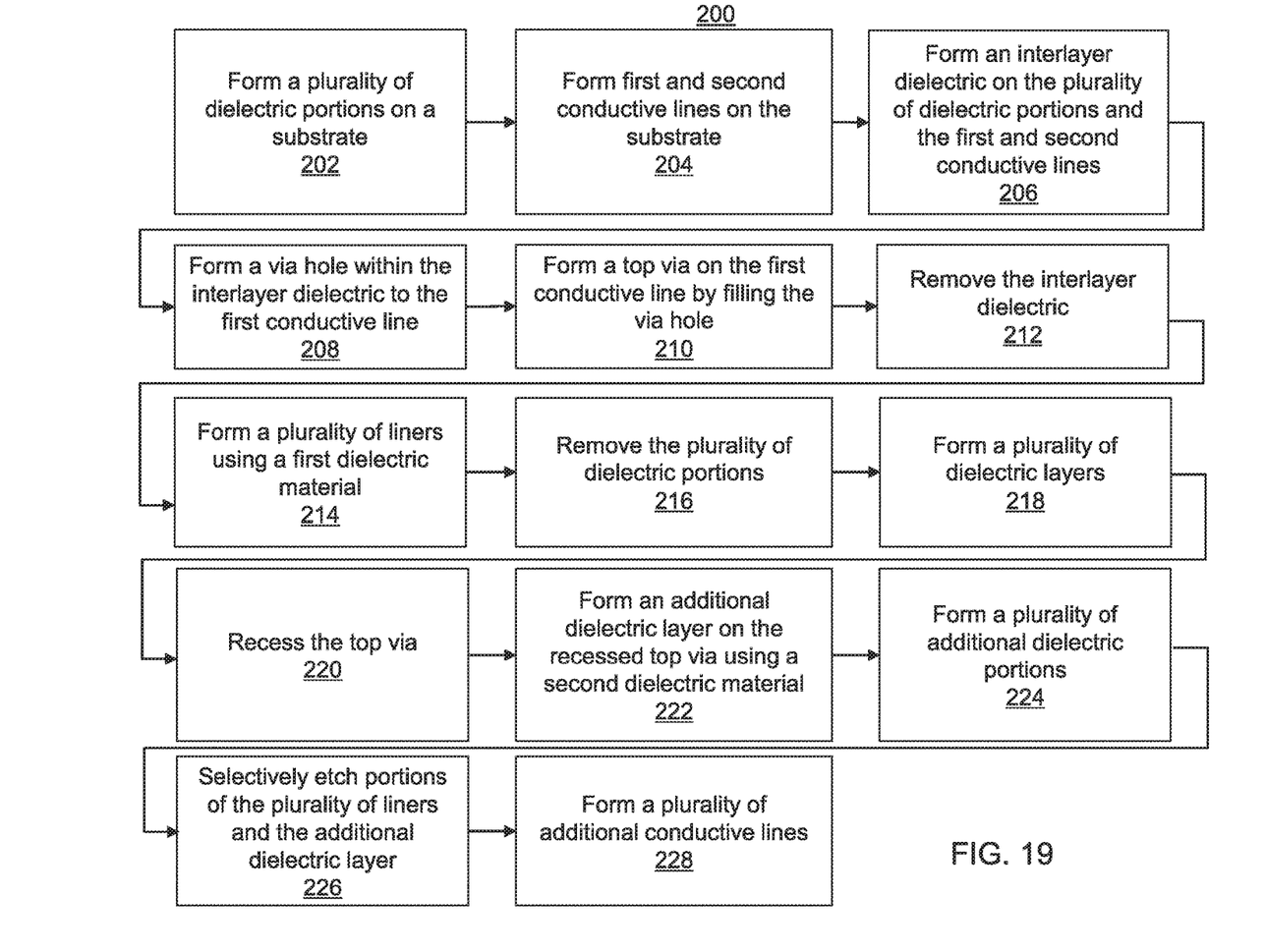
FIG. 19 is a block/flow diagram illustrating a system/method for fabricating a semiconductor device to account for misalignment, in accordance with an embodiment of the present invention.

With reference to FIG. 19, a block/flow diagram is shown illustrating a system/method 200 for fabricating a semiconductor device to account for misalignment.

At block 202, a plurality of dielectric portions are formed on a substrate. Forming the plurality of dielectric portions can include forming dielectric material on the substrate, and forming trenches within the dielectric material separating the plurality of dielectric portions. Any suitable process can be used to form the plurality of dielectric portions in accordance with the embodiments described herein.

At block 204, first and second conductive lines are formed on the substrate. The first conductive line can be formed within a first trench between first and second ones of the plurality of dielectric portions, and the second conductive line can be formed on the substrate within a second trench between the second dielectric portion and a third one of the plurality of dielectric portions. For example, forming the first and second conductive lines can include filling the first and second trenches with the first conductive material, and planarizing and recessing the first conductive material within the first and second trenches. Any suitable process can be used to form the plurality of dielectric portions in accordance with the embodiments described herein.

At block 206, an interlayer dielectric is formed on the plurality of dielectric portions and the first and second conductive lines. Any suitable process can be used to form the interlayer dielectric in accordance with the embodiments described herein.

At block 208, a via hole is formed within the interlayer dielectric to the first conductive line. Any suitable process can be used to form the via hole in accordance with the embodiments described herein.

At block 210, a top via is formed on the first conductive line by filling the via hole. The top via can be formed adjacent to the first and second dielectric portions.

At block 212, the interlayer dielectric is removed. Any suitable process can be used to remove the interlayer dielectric in accordance with the embodiments described herein.

At block 214, a plurality of liners each is formed using a first dielectric material. The first dielectric material can include a dielectric material having a breakdown voltage for increasing device reliability with respect to device misalignment. For example, the plurality of liners can each be formed to include a dielectric material having a density and porosity corresponding to a breakdown voltage that can be used for increasing device reliability with respect to device misalignment, as described above with reference to FIG. 10.

Forming the plurality of liners can include forming first and second liners to a first height along sidewalls of the top via. The first and second liners can be formed on sidewalls of the first and second dielectric portions. In one embodiment, forming the plurality of liners can further include forming a third liner on the second conductive line along another sidewall of the second dielectric portion, and forming a fourth liner on the second conductive line along a sidewall of a third one of the plurality of dielectric portions. Any suitable process can be used to form the plurality of liners in accordance with the embodiments described herein.

At block 216, the plurality of dielectric portions are removed. Any suitable process can be used to remove the plurality of dielectric portions in accordance with the embodiments described herein.

At block 218, a plurality of dielectric layers are formed. Forming the plurality of dielectric layers can include forming first and second dielectric layers on the first conductive line to the first height and adjacent to the first and second liners, respectively. In one embodiment, forming the plurality of dielectric layers further includes forming third, fourth and fifth dielectric layers on the substrate, and forming a sixth dielectric layer on the second conductive line. Any suitable process can be used to form the plurality of dielectric layers in accordance with the embodiments described herein. In one embodiment, at least the third and fourth liners can optionally be removed at block 218 due to their small footage.

At block 220, the top via is recessed. The top via can be recessed to a second height. Any suitable process can be used to recess the top via in accordance with the embodiments described herein.

At block 222, an additional dielectric layer is formed on the recessed top via using a second dielectric material. The additional dielectric layer can be formed to the first height. Any suitable process can be used to form the additional dielectric layer in accordance with the embodiments described herein. More specifically, the additional dielectric layer can be formed to include a dielectric material having a breakdown voltage for increasing device reliability with respect to device misalignment. For example, the additional dielectric layer can be formed to include a dielectric material having a density and porosity corresponding to a breakdown voltage that can be used for increasing device reliability with respect to device misalignment, as described above with reference to FIG. 10. The additional dielectric layer can be formed to include a same or similar material as the plurality of liners.

At block 224, a plurality of additional dielectric portions are formed. Forming the plurality of additional dielectric portions can include depositing dielectric material, and forming trenches corresponding to the first and second conductive lines. For example, forming the plurality of additional dielectric portions can include forming a first additional dielectric portion on the first dielectric layer, forming a second additional dielectric portion on a remaining portion of the additional dielectric layer, the second liner and the second dielectric layer, and forming a third additional dielectric portion on the second dielectric layer. Any suitable process can be used to form the plurality of additional dielectric portions in accordance with the embodiments described herein.

At block 226, portions of the plurality of liners and the additional dielectric layer are selectively etched. The selective etching creates a void between the first dielectric layer and a remaining portion of the additional dielectric layer. Any suitable process can be used to perform the selective etching in accordance with the embodiments described herein.

At block 228, a plurality of additional conductive lines are formed. Forming the plurality of additional conductive lines can include forming first and second additional conductive lines by filling the trenches between the additional dielectric portions and the void with a second conductive material, and planarizing the second conductive material. For example, forming the plurality of additional conductive lines can include forming the first additional conductive line on the first, third, fourth, fifth and sixth dielectric layers, the first, third and fourth liners, and the top via, and forming the second additional conductive line on the second dielectric layer between the second and third additional dielectric portions. The first additional conductive line can be electrically connected to the top via, while the second additional conductive line can be isolated from the first additional conductive line and the top via. Any suitable process can be used to form the additional conductive lines in accordance with the embodiments described herein.

Further details regarding blocks 202-228 are described above with reference to FIGS. 1-18.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device to account for misalignment, comprising:
   forming a top via on a first conductive line formed on a substrate;
   after forming the top via, forming a plurality of liners using a first dielectric material, including forming first and second liners to a first height along sidewalls of the top via;
   forming a plurality of dielectric layers, including forming first and second dielectric layers on the first conductive line to the first height and adjacent to the first and second liners, respectively;
   recessing the top via to a second height; and
   forming an additional dielectric layer on the recessed top via to the first height using a second dielectric material, wherein the first and second dielectric materials are selected to compensate for potential misalignment between the first conductive line and the top via.

2. The method of claim 1, further comprising:
   forming a plurality of dielectric portions on the substrate; and
   forming the first conductive line and a second conductive line on the substrate, including filling trenches between the plurality of dielectric portions with a first conductive material, and planarizing and recessing the first conductive material within the trenches.

3. The method of claim 2, wherein:
   the top via is formed adjacent to first and second ones of the plurality of dielectric portions;
   the first and second liners are formed on sidewalls of the first and second dielectric portions; and
   forming the plurality of liners further includes forming a third liner on the second conductive line along another sidewall of the second dielectric portion, and forming a fourth liner on the second conductive line along a sidewall of a third one of the plurality of dielectric portions.

4. The method of claim 2, further comprising:
   forming an interlayer dielectric on the plurality of dielectric portions and the first and second conductive lines, wherein forming the top via further includes filling a via hole formed within the interlayer dielectric to the first conductive line; and
   removing the interlayer dielectric prior to forming the plurality of liners.

5. The method of claim 2, further comprising:
forming a plurality of additional dielectric portions;
selectively etching portions of the plurality of liners and the additional dielectric layer, including creating a void between the first dielectric layer and a remaining portion of the additional dielectric layer; and
forming first and second additional conductive lines by filling trenches between the plurality of additional dielectric portions and the void with a second conductive material, and planarizing the second conductive material.

6. The method of claim 5, wherein forming the plurality of additional dielectric portions further includes:
forming a first additional dielectric portion on the first dielectric layer;
forming a second additional dielectric portion on a remaining portion of the additional dielectric layer, the second liner and the second dielectric layer; and
forming a third additional dielectric portion on the second dielectric layer.

7. The method of claim 5, wherein forming the plurality of dielectric layers further includes:
forming third, fourth and fifth dielectric layers on the substrate; and
forming a sixth dielectric layer on the second conductive line.

8. The method of claim 7, wherein forming the first and second additional conductive lines further includes:
forming the first additional conductive line on the first, third, fourth, fifth and sixth dielectric layers, the first, third and fourth liners, and the top via; and
forming the second additional conductive line on the second dielectric layer between the second and third additional dielectric portions.

9. A method for fabricating a semiconductor device to account for misalignment, comprising:
forming a plurality of dielectric portions on a substrate;
forming a first conductive line on the substrate within a trench between first and second ones of the plurality of dielectric portions;
forming a top via on the first conductive line adjacent to the first and second dielectric portions;
forming a plurality of liners using a first dielectric material, including forming first and second liners to a first height along sidewalls of the top via;
forming a plurality of dielectric layers after removing the plurality of dielectric portions, including forming first and second dielectric layers on the first conductive line to the first height and adjacent to the first and second liners, respectively;
recessing the top via to a second height; and
forming an additional dielectric layer on the recessed top via to the first height using a second dielectric material, wherein the first and second dielectric materials are selected to compensate for potential misalignment between the first conductive line and the top via.

10. The method of claim 9, further comprising forming a second conductive line on the substrate within a second trench between the second dielectric portion and a third one of the plurality of dielectric portions, wherein forming the first and second conductive lines includes filling the first and second trenches with the first conductive material, and planarizing and recessing the first conductive material within the first and second trenches.

11. The method of claim 10, wherein:
the first and second liners are formed on sidewalls of the first and second dielectric portions; and
forming the plurality of liners further includes forming a third liner on the second conductive line along another sidewall of the second dielectric portion, and forming a fourth liner on the second conductive line along a sidewall of a third one of the plurality of dielectric portions.

12. The method of claim 10, further comprising:
forming an interlayer dielectric on the plurality of dielectric portions and the first and second conductive lines, wherein forming the top via further includes filling a via hole formed within the interlayer dielectric to the first conductive line; and
removing the interlayer dielectric prior to forming the plurality of liners.

13. The method of claim 10, further comprising:
forming a plurality of additional dielectric portions;
selectively etching portions of the plurality of liners and the additional dielectric layer, including creating a void between the first dielectric layer and a remaining portion of the additional dielectric layer; and
forming first and second additional conductive lines by filling trenches between the plurality of additional dielectric portions and the void with a second conductive material, and planarizing the second conductive material.

14. The method of claim 13, wherein forming the plurality of additional dielectric portions further includes:
forming a first additional dielectric portion on the first dielectric layer;
forming a second additional dielectric portion on a remaining portion of the additional dielectric layer, the second liner and the second dielectric layer; and
forming a third additional dielectric portion on the second dielectric layer.

15. The method of claim 13, wherein forming the plurality of dielectric layers further includes:
forming third, fourth and fifth dielectric layers on the substrate; and
forming a sixth dielectric layer on the second conductive line.

16. The method of claim 15, wherein forming the first and second additional conductive lines further includes:
forming the first additional conductive line on the first, third, fourth, fifth and sixth dielectric layers, the first, third and fourth liners, and the top via; and
forming the second additional conductive line on the second dielectric layer between the second and third additional dielectric portions.

* * * * *